United States Patent
Lee et al.

(10) Patent No.: US 11,765,793 B2
(45) Date of Patent: Sep. 19, 2023

(54) SUBSTRATE TREATING APPARATUS

(71) Applicant: SEMES CO., LTD., Chungcheongnam-do (KR)

(72) Inventors: Muhyeon Lee, Chungcheongnam-do (KR); Gui Su Park, Chungcheongnam-do (KR); Byungsun Bang, Gyeonggi-do (KR); Jungbong Choi, Gyeonggi-do (KR); Youngil Lee, Chungcheongnam-do (KR); Kangseop Yun, Chungcheongnam-do (KR); Seung Eun Na, Gyeonggi-do (KR); Ye Jin Choi, Seoul (KR); Kyounghwan Kim, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 566 days.

(21) Appl. No.: 16/932,286

(22) Filed: Jul. 17, 2020

(65) Prior Publication Data
US 2021/0022213 A1   Jan. 21, 2021

(30) Foreign Application Priority Data
Jul. 18, 2019 (KR) .................. 10-2019-0087223

(51) Int. Cl.
*H05B 3/06* (2006.01)
*H01L 21/683* (2006.01)
(Continued)

(52) U.S. Cl.
CPC ....... *H05B 3/0047* (2013.01); *H01L 21/6708* (2013.01); *H01L 21/683* (2013.01);
(Continued)

(58) Field of Classification Search
None
See application file for complete search history.

(56) References Cited

U.S. PATENT DOCUMENTS

| | | | | |
|---|---|---|---|---|
| 2004/0108519 A1* | 6/2004 | Itani | .................. | H01L 21/67115 257/200 |
| 2006/0240574 A1* | 10/2006 | Yoshie | .............. | H01L 21/67103 438/1 |

(Continued)

FOREIGN PATENT DOCUMENTS

| | | | | |
|---|---|---|---|---|
| JP | 2000349038 A | | 12/2000 | |
| JP | 2002203804 A | * | 7/2002 | ........ H01L 21/67115 |

(Continued)

OTHER PUBLICATIONS

Notice of Allowance for related Korean Patent Application No. 9-5-2021-039545959 dated May 18, 2021 (5 pages).
(Continued)

*Primary Examiner* — Joseph M. Pelham
(74) *Attorney, Agent, or Firm* — Procopio, Cory, Hargreaves & Savitch LLP (57) ABSTRACT

An apparatus for treating a substrate includes a process chamber having a treatment space defined therein, a support unit for supporting the substrate in the treatment space, a liquid supply unit for supplying treating liquid to the substrate supported on the support unit, and a heating unit disposed in the support unit for heating the substrate supported on the support unit, wherein the heating unit includes a plurality of lamps to heat the substrate, and a window disposed above the lamps to transmit light emitted from the lamps, wherein the window includes a base in a form of a plate, and light adjustment means formed on the base to spread or converge light emitted from the lamps.

20 Claims, 10 Drawing Sheets

(51) Int. Cl.
  *H01L 21/67* (2006.01)
  *H05B 3/00* (2006.01)
  *H01L 21/687* (2006.01)

(52) U.S. Cl.
  CPC ......... *H01L 21/68714* (2013.01); *H05B 3/06* (2013.01); *H01L 21/67* (2013.01); *H01L 21/67005* (2013.01); *H01L 21/67115* (2013.01)

(56) References Cited

U.S. PATENT DOCUMENTS

| | | | |
|---|---|---|---|
| 2017/0243770 A1* | 8/2017 | Abe | H05B 3/0047 |
| 2018/0301360 A1* | 10/2018 | Nishide | G02B 5/0231 |
| 2019/0019697 A1* | 1/2019 | Miyake | H01L 21/67115 |
| 2019/0027384 A1* | 1/2019 | Nishide | H01L 21/67115 |
| 2019/0088513 A1* | 3/2019 | Furukawa | H01L 21/68742 |
| 2019/0115224 A1 | 4/2019 | Lee et al. | |
| 2022/0028708 A1* | 1/2022 | Yun | H01L 21/67115 |
| 2022/0051915 A1* | 2/2022 | Nishide | G02B 5/0215 |
| 2022/0076970 A1* | 3/2022 | Ueda | H01L 21/68742 |
| 2022/0159788 A1* | 5/2022 | Kim | H01L 21/6875 |
| 2022/0181168 A1* | 6/2022 | Yun | H01L 21/67115 |

FOREIGN PATENT DOCUMENTS

| | | |
|---|---|---|
| JP | 2004-186495 A | 7/2004 |
| JP | 2005109090 A | 4/2005 |
| JP | 2014016305 A | 1/2014 |
| JP | 2018182153 A | 11/2018 |
| KR | 10-1324211 B1 | 11/2013 |
| KR | 10-2014-0047564 A | 4/2014 |
| KR | 10-2019-0037835 A | 4/2019 |
| KR | 10-2019-0037846 A | 4/2019 |

OTHER PUBLICATIONS

Office Action for related Korean Patent Application No. 10-2019-0087223 dated Aug. 6, 2020 (8 pages).

* cited by examiner

SUBSTRATE TREATING APPARATUS

CROSS-REFERENCE TO RELATED APPLICATIONS

A claim for priority under 35 U.S.C. § 119 is made to Korean Patent Application No. 10-2019-0087223 filed on Jul. 18, 2019, in the Korean Intellectual Property Office, the entire contents of which are hereby incorporated by reference.

BACKGROUND

Embodiments of the inventive concept described herein relate to a substrate treating apparatus, and more particularly, to a substrate treating apparatus that treats a substrate in a state in which the substrate is heated.

In general, in a process of treating a glass or a substrate in a flat panel display device manufacturing process or a semiconductor manufacturing process, various processes such as a photoresist coating process, a developing process, an etching process, and an ashing process are performed.

Each process includes a wet cleaning process using a chemical liquid or deionized water to remove various contaminants attached to the substrate, and a drying process to dry the chemical or deionized water remaining on the surface of the substrate.

Recently, an etching process is performed to remove a silicon nitride film and a silicon oxide film using a chemical aqueous solution used at a high temperature such as phosphoric acid. A substrate treating apparatus using a high-temperature chemical aqueous solution includes a substrate heating apparatus using a lamp to heat the substrate to improve an etching rate.

In general, a plurality of lamps are arranged concentrically with each other. In this case, the lamp is not disposed in a region facing a center of the substrate, such that a central region of the substrate is less heated than other regions thereof.

Further, when viewed from above, a lamp located on an outermost side is located inwardly of an end of the substrate due to various structural factors, such that an edge region of the substrate is relatively less heated compared to other regions.

This results in lowered etch uniformity in the central and edge regions of the substrate compared to other regions thereof.

SUMMARY

Embodiments of the inventive concept provide a substrate treating apparatus capable of uniformly heating a substrate during a substrate treating process.

Further, embodiments of the inventive concept provide a substrate treating apparatus that prevents deterioration of treating efficiency of the substrate otherwise occurring when an edge region of the substrate is less heated during a substrate treating process.

Further, embodiments of the inventive concept provide a substrate treating apparatus that prevents deterioration of treating efficiency of the substrate otherwise occurring when a central region of the substrate is less heated during a substrate treating process.

The purpose of the inventive concept is not limited thereto. Other purposes not mentioned will be clearly understood by those skilled in the art from following descriptions.

According to an exemplary embodiment, an apparatus for treating a substrate includes a process chamber having a treatment space defined therein, a support unit for supporting the substrate in the treatment space, a liquid supply unit for supplying treating liquid to the substrate supported on the support unit, and a plurality of lamps disposed in the support unit for heating the substrate supported on the support unit, wherein the support unit includes a rotatable chuck stage, and a window disposed above the lamps to transmit light emitted from the lamps, wherein the window includes a base in a form of a plate, and light adjustment means formed on the base to adjust a direction or an amount of light emitted from the lamps.

The light adjustment means may include an edge convex portion protruding from the base, wherein a position of the edge convex portion corresponds to an edge region of the substrate placed on the support unit.

The light adjustment means may include a central convex portion protruding from the base, wherein a position of the central convex portion corresponds to a central region of the substrate placed on the support unit.

The light adjustment means may include an edge convex portion protruding from the base, wherein a position of the edge convex portion corresponds to an edge region of the substrate placed on the support unit, and a central convex portion protruding from the base, wherein a position of the central convex portion corresponds to a central region of the substrate placed on the support unit.

The support unit may include a support pin for supporting a bottom surface of the substrate, and a chuck pin for supporting a side surface of the substrate, wherein the support pin may be installed on the window.

The edge convex portion may have an inward portion and an outward portion, wherein the inward portion may have a top inclined face having a smaller inclination than an inclination of a top inclined face of the outward portion.

The edge convex portion may extend in a ring shape.

A width of the central convex portion may be larger than a width of the edge convex portion.

A region of the window between the edge convex portion and the central convex portion may be flat.

The light adjustment means further may include a concave portion recessed in the base, wherein the concave portion may be disposed between the edge convex portion and the central convex portion to spread light emitted from the lamps.

An outermost lamp among the lamps may be located inwardly of an end of the substrate placed on the support unit when viewed from above.

The light adjustment means may be formed on a top surface of the window.

The light adjustment means may be formed on a bottom surface of the window.

Each of the lamps extends in a ring shape, and the lamps are concentric with each other.

The base and the light adjustment means may be integrally formed with each other.

The treating liquid may include phosphoric acid.

The window may be made of quartz.

According to an exemplary embodiment, an apparatus for treating a substrate includes a support member for supporting the substrate, a lamp for heating the substrate placed on the support member, and a window placed between the lamp and the substrate placed on the support member to transmit light emitted from the lamp, wherein the window includes a base in a form of a plate, and light adjustment means formed on the base to converge or spread light emitted from the lamp.

The light adjustment means may be formed on a surface of the window facing the substrate.

The light adjustment means may include an edge convex portion protruding from the base, wherein a position of the edge convex portion corresponds to an edge region of the substrate placed on the support unit.

The light adjustment means may include a central convex portion protruding from the base, wherein a position of the central convex portion corresponds to a central region of the substrate placed on the support unit.

The edge convex portion may have an inward portion and an outward portion, wherein the inward portion may have a top inclined face having a smaller inclination than an inclination of a top inclined face of the outward portion.

The light adjustment means may include an edge convex portion protruding from the base, wherein a position of the edge convex portion corresponds to an edge region of the substrate placed on the support unit, and a central convex portion protruding from the base, wherein a position of the central convex portion corresponds to a central region of the substrate placed on the support unit.

A region of the window between the edge convex portion and the central convex portion may be flat.

The base and the light adjustment means may be made of the same material.

The base and the light adjustment means may be integrally formed with each other.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, the inventive concept may be subjected to various modifications and may have various embodiments. Specific embodiments will be illustrated in the drawings and described in detail in the detailed descriptions. However, this is not intended to limit the inventive concept to the specific embodiments. It should be understood that all of modifications, equivalents, and substitutes, etc. thereto are included in a scope and idea of the inventive concept. In describing the inventive concept, when it is determined that a detailed description of a related known component may obscure the gist of the inventive concept, the detailed description thereof is omitted.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section.

Hereinafter, embodiments according to the inventive concept will be described in detail with reference to the accompanying drawings. In referring to the accompanying drawings, the same or corresponding components are assigned the same reference numerals, and redundant descriptions thereof will be omitted.

Figure 1:
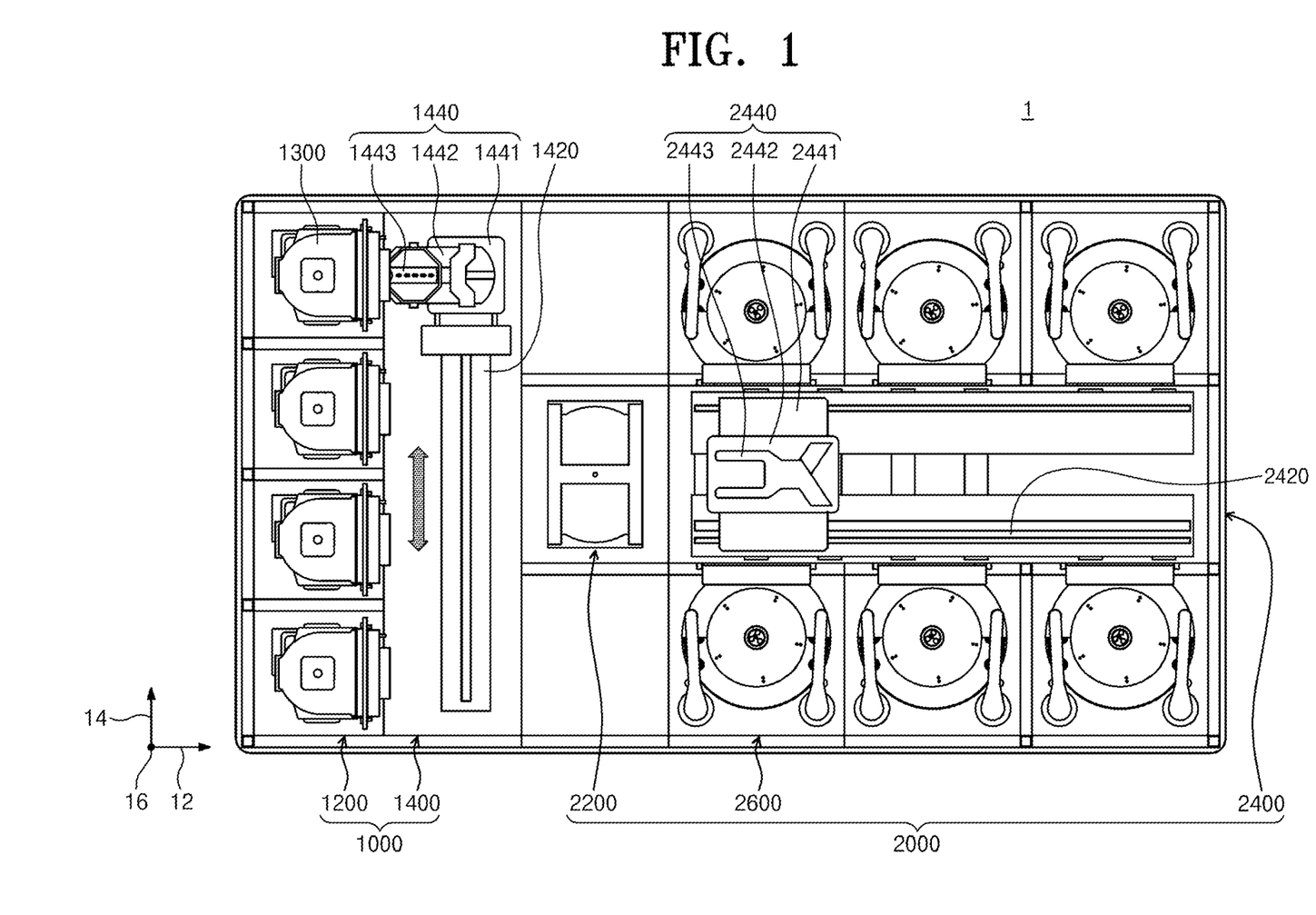
FIG. 1 is a plan view schematically showing an example of a substrate treating system having a substrate treating apparatus according to an example of the inventive concept.

FIG. 1 is a plan view schematically showing a substrate treating system 1 of the inventive concept.

Referring to FIG. 1, the substrate treating system 1 includes an index module 1000 and a process treating module 2000. The index module 1000 includes a load port 1200 and a transfer frame 1400. The load port 1200, the transfer frame 1400, and the process treating module 2000 are sequentially arranged in series. Hereinafter, a direction in which the load port 1200, the transfer frame 1400, and the process treating module 2000 are arranged is referred to as a first direction 12. A direction perpendicular to the first direction 12 when viewed from above is referred to as a second direction 14. A direction perpendicular to a plane including the first direction 12 and the second direction 14 is referred to as a third direction 16.

A carrier 1300 in which the substrate W is stored is seated on the load port 1200. A plurality of load ports 1200 are arranged in a row along the second direction 14. FIG. 1 shows that four load ports 1200 are provided. However, the number of the load ports 1200 may increase or decrease depending on conditions such as process efficiency and footprint of the process treating module 2000. The carrier 1300 has a slot (not shown) defined therein to support an edge of a substrate W. A plurality of slots are arranged in the third direction 16. The substrates W are placed in the carrier 1300 in a stacked manner while the substrates W are spaced apart from each other along the third direction 16. The carrier 1300 may include FOUP (Front Opening Unified Pod).

The process treating module 2000 includes a buffer unit 2200, a transfer chamber 2400, and a process chamber 2600. The transfer chamber 2400 has a length direction parallel to the first direction 12. The process chambers 2600 are arranged on each of one side and the other side of the transfer chamber 2400 and along the first direction 12. The process chambers 2600 located on one side of the transfer chamber 2400 and the process chambers 2600 located on the other side of the transfer chamber 2400 may be symmetrical with each other respect to the transfer chamber 2400. Some of the process chambers 2600 are arranged along a length direction of the transfer chamber 2400. Further, some of the process chamber 2600 are stacked vertically.

That is, on one side of the transfer chamber 2400, the process chambers 2600 may be arranged in a matrix of A×B (each of A and B is a natural number of 1 or greater). In this connection, A is the number of the process chambers 2600 arranged in a line along the first direction 12. B is the number of the process chambers 2600 arranged in series along the third direction 16. When 4 or 6 process chambers 2600 are arranged on one side of the transfer chamber 2400, the process chambers 2600 may be arranged in a 2×2 or 3×2 matrix. The number of the process chambers 2600 may be increased or decreased. Alternatively, the process chambers 2600 may be arranged only on one side of the transfer chamber 2400. Further, as described above, the process chambers 2600 may be arranged in a single layer on one side or on each of both sides of the transfer chamber 2400.

The buffer unit 2200 is disposed between the transfer frame 1400 and the transfer chamber 2400. The buffer unit 2200 provides a space where the substrate W stays before the substrate W is transferred between the transfer chamber 2400 and the transfer frame 1400. The buffer unit 2200 has a slot (not shown) in which the substrate W is placed. A plurality of slots (not shown) are arranged to be spaced apart from each other along the third direction 16. Each of a side of the buffer unit 2200 facing the transfer frame 1400 and a side thereof facing the transfer chamber 2400 is opened.

The transfer frame 1400 transfers the substrate W between the carrier 1300 mounted on the load port 1200 and the buffer unit 2200. An index rail 1420 and an index robot 1440 are disposed in the transfer frame 1400. The index rail 1420 has a length direction parallel to the second direction 14.

The index robot 1440 is installed on the index rail 1420, and linearly moves along the index rail 1420 in the second direction 14. The index robot 1440 has a base 1441, a body 1442, and an index arm 1443. The base 1441 is installed to be movable along the index rail 1420. The body 1442 is coupled to the base 1441. The body 1442 is configured to be movable along the third direction 16 on the base 1441. Further, the body 1442 is configured to be rotatable on the base 1441.

The index arm 1443 is coupled to the body 1442 and is configured to be movable forward and backward relative to the body 1442. A plurality of index arms 1443 may be configured to operate individually. The index arms 1443 are arranged in a stacked manner in a state in which the index arms are spaced apart from each other along the third direction 16. Some of the index arms 1443 may be used to transfer the substrate W from the process treating module 2000 to the carrier 1300. The rest thereof may be used to transfer the substrate W from the carrier 1300 to the process treating module 2000. This may prevent particles generated from the substrate W before the process treatment from being attached to the substrate W after the process treatment in a process in which the index robot 1440 imports and exports the substrate W.

The transfer chamber 2400 transfers the substrate W between the buffer unit 2200 and the process chamber 2600, and between the process chambers 2600. A guide rail 2420 and a main robot 2440 are disposed in the transfer chamber 2400. The guide rail 2420 has a length direction parallel to the first direction 12. The main robot 2440 is installed on the guide rail 2420, and moves linearly on the guide rail 2420 along the first direction 12. The main robot 2440 has a base 2441, a body 2442, and a main arm 2443. The base 2441 is installed to be movable along the guide rail 2420. The body 2442 is coupled to the base 2441. The body 2442 is configured to be movable along the third direction 16 and on the base 2441.

Further, the body 2442 is configured to be rotatable on the base 2441.

The main arm 2443 is joined to the body 2442, and is configured to move forward and backward relative to the body 2442. A plurality of the main arms 2443 may be configured to be individually driven. The main arms 2443 are arranged in a stacked manner in a state in which the main arms are spaced apart from each other along the third direction 16. The main arm 2443 used to transfer the substrate W from the buffer unit 2200 to the process chamber 2600 and the main arm 2443 used to transfer the substrate W from the process chamber 2600 to the buffer unit 2200 may be different from each other.

In the process chamber 2600, a substrate treating apparatus 10 for performing a cleaning process on the substrate W is disposed. The substrate treating apparatuses 10 respectively disposed in the process chambers 2600 may have different structures according to types of the cleaning process to be performed. Alternatively, the substrate treating apparatuses 10 respectively disposed in the process chambers 2600 may have the same structure. Alternatively, the process chambers 2600 may be divided into a plurality of groups, and the substrate treating apparatuses 10 respectively disposed in the process chambers 2600 belonging to the same group may have the same structure, and the substrate treating apparatuses 10 respectively disposed in the process chambers 2600 belonging to different groups may have different structures from each other.

For example, when the process chambers 2600 are divided into two groups, a first group of process chambers 2600 may be arranged on one side of the transfer chamber 2400 and a second group of process chambers 2600 may be arranged on the other side of the transfer chamber 2400. Alternatively, the first group of process chambers 2600 may be disposed in a lower layer on each of one side and the other side of the transfer chamber 2400, while the second group of process chambers 2600 may be disposed in an upper layer on each of one side and the other side of the transfer chamber 2400. The first group of process chamber 2600 and the second group of process chamber 2600 may be distinguished from each other based on the types of chemicals as used or the types of the cleaning schemes.

In a following example, an apparatus for cleaning the substrate W using treating fluids such as high temperature sulfuric acid, alkaline chemicals, acidic chemicals, rinse liquids, and dry gas will be described by way of an example. However, a technical idea of the inventive concept is not limited thereto. The following example may be applied to all types of apparatuses performing a process while rotating the substrate W, such as an etching process.

Figure 2:
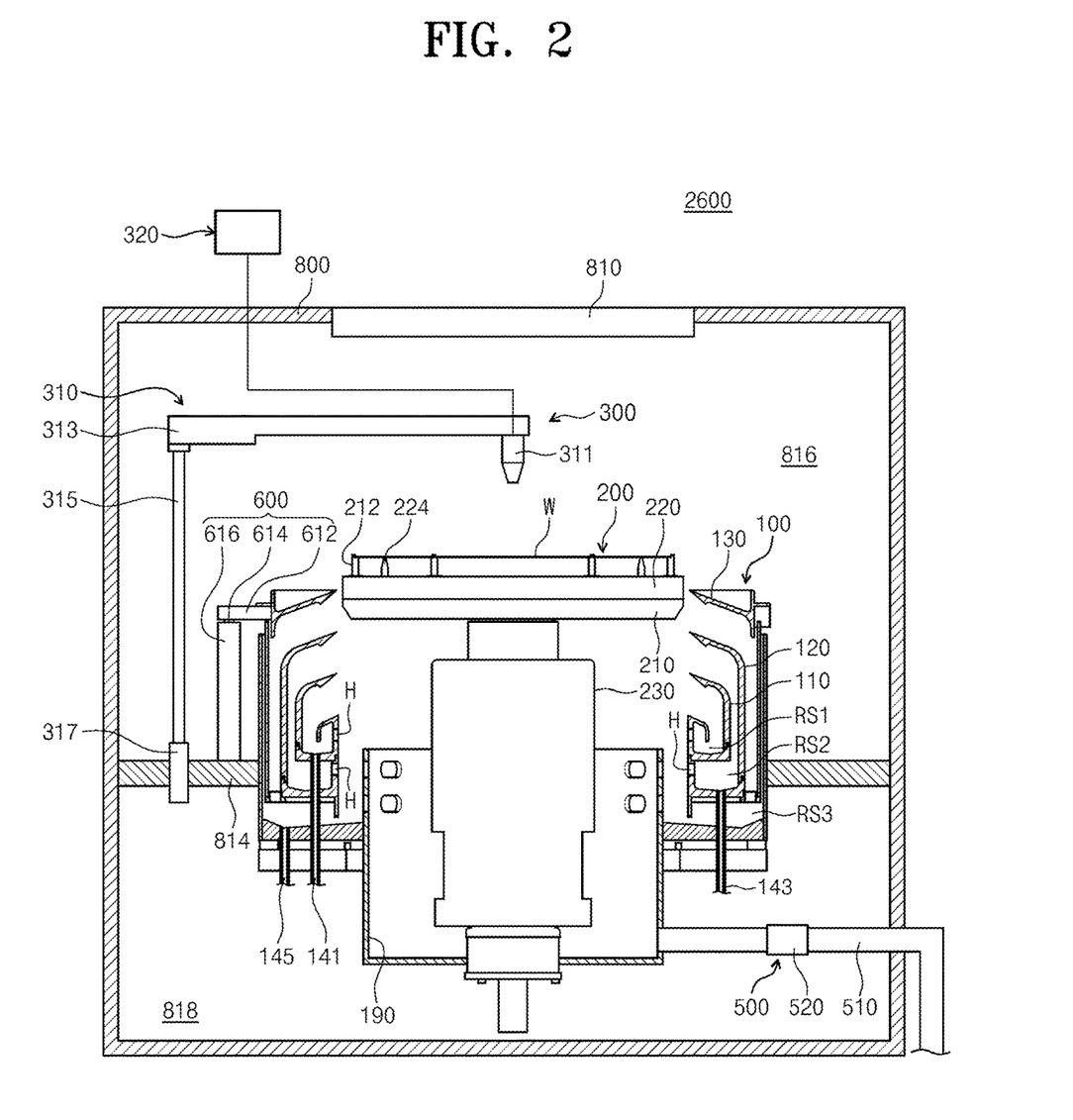
FIG. 2 is a plan view of the substrate treating apparatus of FIG. 1.
Figure 3:
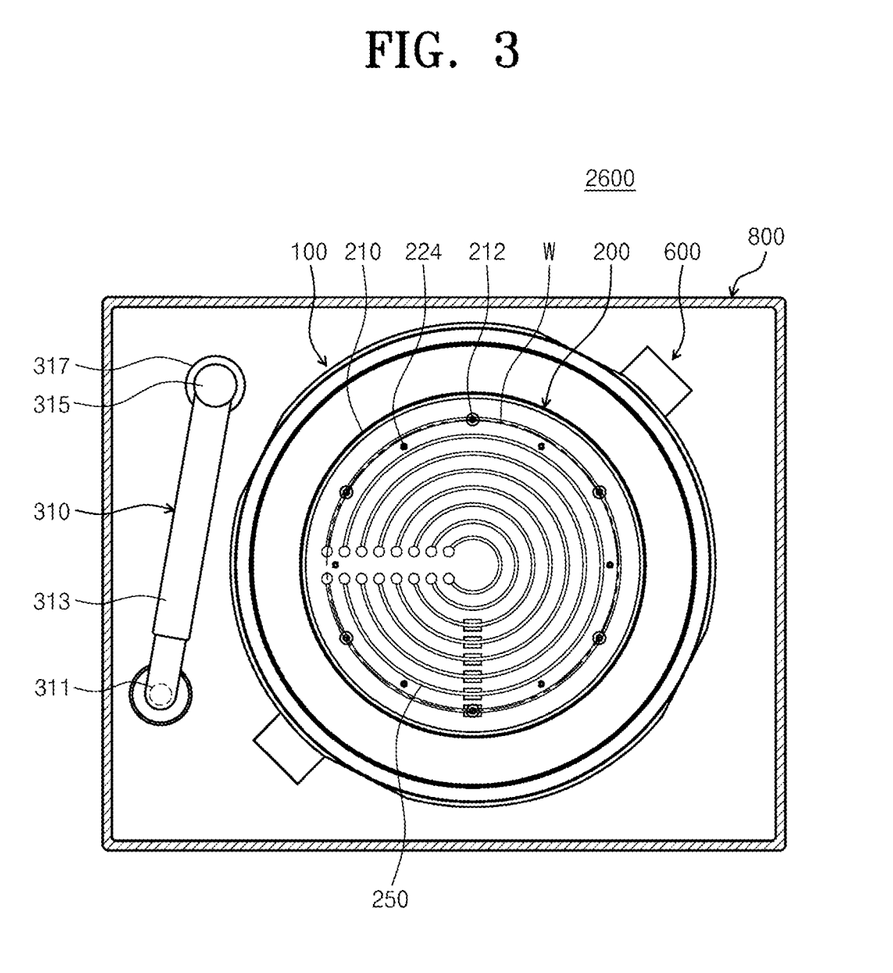
FIG. 3 is a cross-sectional view of the substrate treating apparatus of FIG. 1.

FIG. 2 is a plan view of the substrate treating apparatus of FIG. 1. FIG. 3 is a cross-sectional view of the substrate treating apparatus of FIG. 1. Referring to FIG. 2 and FIG. 3, the substrate treating apparatus 10 includes a chamber 800, a treating container 100, a support unit 200, a heating unit 280, a liquid supply unit 300, a process exhaust unit 500, and an ascending and descending unit 600.

The chamber 800 provides an enclosed interior space. A flow supply unit 810 is installed at a top of the chamber 800. The flow supply unit 810 generates downward flow inside the chamber 800.

The flow supply unit 810 filters high humidity outside-air and supplies the same into the chamber. The high humidity outside-air passes through the flow supply unit 810, and is supplied into the chamber, and generates a descending air flow. The downward air flow provides uniform flow above the substrate W, and discharges contaminants generated during the treatment of a surface of the substrate W using the treating fluid to the process exhaust unit 500 through collection vessels 110, 120, and 130 of the treating container 100 together with air.

The chamber 800 is divided into a process region 816 and a maintenance region 818 via a horizontal partitioning wall 814. In the process region 816, the treating container 100 and the support unit 200 are located. An actuator for the ascending and descending unit 600, an actuator connected to the liquid supply unit 300, and a supply line in addition to exhaust lines 141, 143, and 145 and an exhaust line 510 connected to the treating container 100 are disposed in the maintenance region 818. The maintenance region 818 is isolated from the process region 816.

The treating container 100 has a cylindrical shape with an open top, and provides a process space for treating the substrate W. The opened top face of the treating container 100 acts as a passage for carrying out and carrying in the substrate W. The support unit 200 is located in the process space. The support unit 200 rotates the substrate W in a state that the support unit 200 supports the substrate W during the process.

The treating container 100 provides a lower space whose a bottom is connected to an exhaust duct 190 to activate forced exhaust. In the treating container 100, the first to third collection vessels 110, 120 and 130 are disposed at different vertical levels to intake and suction the treating liquid scattered on the rotating substrate W and gases.

The annular first to third collection vessels 110, 120, and 130 have respectively exhaust holes H communicating with one common annular space.

Specifically, each of the first to third collection vessels 110, 120, and 130 includes a bottom surface having an annular ring shape and a side wall having a cylindrical shape and extending from the bottom surface. The second collection vessel 120 surrounds the first collection vessel 110, and is spaced away from the first collection vessel 110. The third collection vessel 130 surrounds the second collection vessel 120, and is spaced away from the second collection vessel 120.

The first to third collection vessels 110, 120, and 130 respectively provide first to third collection spaces RS1, RS2, and RS3 into which the treating liquid scattered from the substrate W and a gas stream containing fume are introduced. The first collection space RS1 is defined in the first collection vessel 110, the second collection space RS2 is defined as a space between the first collection vessel 110 and the second collection vessel 120, and the third collection space RS3 is defined as a space between the second collection vessel 120 and the third collection vessel 130.

Each of top surfaces of the first to third collection vessels 110, 120 and 130 has a central opening. Each of the first to third collection vessels 110, 120, and 130 has a top inclined portion upwardly inclined from the connected side wall to the central opening. The treating liquid scattered from the substrate W flows into the collection spaces RS1, RS2 and RS3 along a surface of the top inclined portion of each of the first to third collection vessels 110, 120 and 130.

First treating liquid flowing into the first collection space RS1 is discharged to an outside through the first collection line 141. Second treating liquid flowing into the second collection space RS2 is discharged to the outside through the second collection line 143. Third treating liquid flowing into the third collection space RS3 is discharged to the outside through the third collection line 145.

The liquid supply unit 300 discharges high-temperature chemicals for etching the surface of the substrate W. In one example, the treating liquid may be phosphoric acid.

A treating liquid nozzle member 310 includes a nozzle 311, a nozzle arm 313, a support rod 315, and a nozzle actuator 317. The nozzle 311 receives the treating liquid through a supply unit 320. The nozzle 311 discharges the treating liquid to the surface of the substrate W. The nozzle arm 313 has a long length in one direction, and the nozzle 311 is mounted on a front end of the nozzle arm 313. The nozzle arm 313 supports the nozzle 311. The support rod 315 is mounted at a rear end of the nozzle arm 313. The support rod 315 is located under the nozzle arm 313. The support rod 315 extends in a perpendicular manner to the nozzle arm 313. The nozzle actuator 317 is provided at a bottom of the support rod 315. The nozzle actuator 317 rotates the support rod 315 around a longitudinal axis of the support rod 315. Due to the rotation of the support rod 315, the nozzle arm 313 and the nozzle 311 swing using the support rod 315 as an axis. The nozzle 311 may swing into and out of the treating container 100. The nozzle 311 swings along a section between a central region and an edge region of the substrate W and discharges the treating liquid.

The process exhaust unit 500 acts to exhaust an inside of the treating container 100. In one example, the process exhaust unit 500 is configured for providing an exhaust pressure (suction pressure) to a collection vessel collecting the treating liquid among the first to third collection vessels 110, 120 and 130 during the process. The process exhaust unit 500 includes the exhaust line 510 connected to the exhaust duct 190 and a damper 520. The exhaust line 510 receives the exhaust pressure from an exhaust pump (not shown) and is connected to a main exhaust line embedded in a bottom space of a semiconductor production line.

In one example, the treating container 100 is combined with the ascending and descending unit 600 to change a vertical position of the treating container 100. The ascending and descending unit 600 moves the treating container 100 in a vertical direction linearly. As the treating container 100 moves up and down, a relative vertical level of the treating container 100 relative to the support unit 200 is changed.

The ascending and descending unit 600 includes a bracket 612, a movable shaft 614, and an actuator 616. The bracket 612 is fixedly installed on an outer wall of the treating container 100. The movable shaft 614 movable in the vertical direction by the actuator 616 is fixedly coupled to the bracket 612. When the substrate W is loaded on a chuck stage 210 or unloaded from the chuck stage 210, the treating container 100 is lowered so that the chuck stage 210 protrudes above the treating container 100. Further, when the process is in progress, the vertical level of the treating container 100 is adjusted so that the treating liquid may be introduced into the collection vessels 110, 120, and 130 preset according to the type of the treating liquid supplied to the substrate W. A relative vertical position between the treating container 100 and the substrate W is changed. The collection spaces RS1, RS2, and RS3 of the treating container 100 may collect different types of the treating liquids and contaminant gases. According to one embodiment, the ascending and descending unit 600 vertically moves the treating container 100 to change the relative vertical position between the treating container 100 and the support unit 200.

Figure 4:
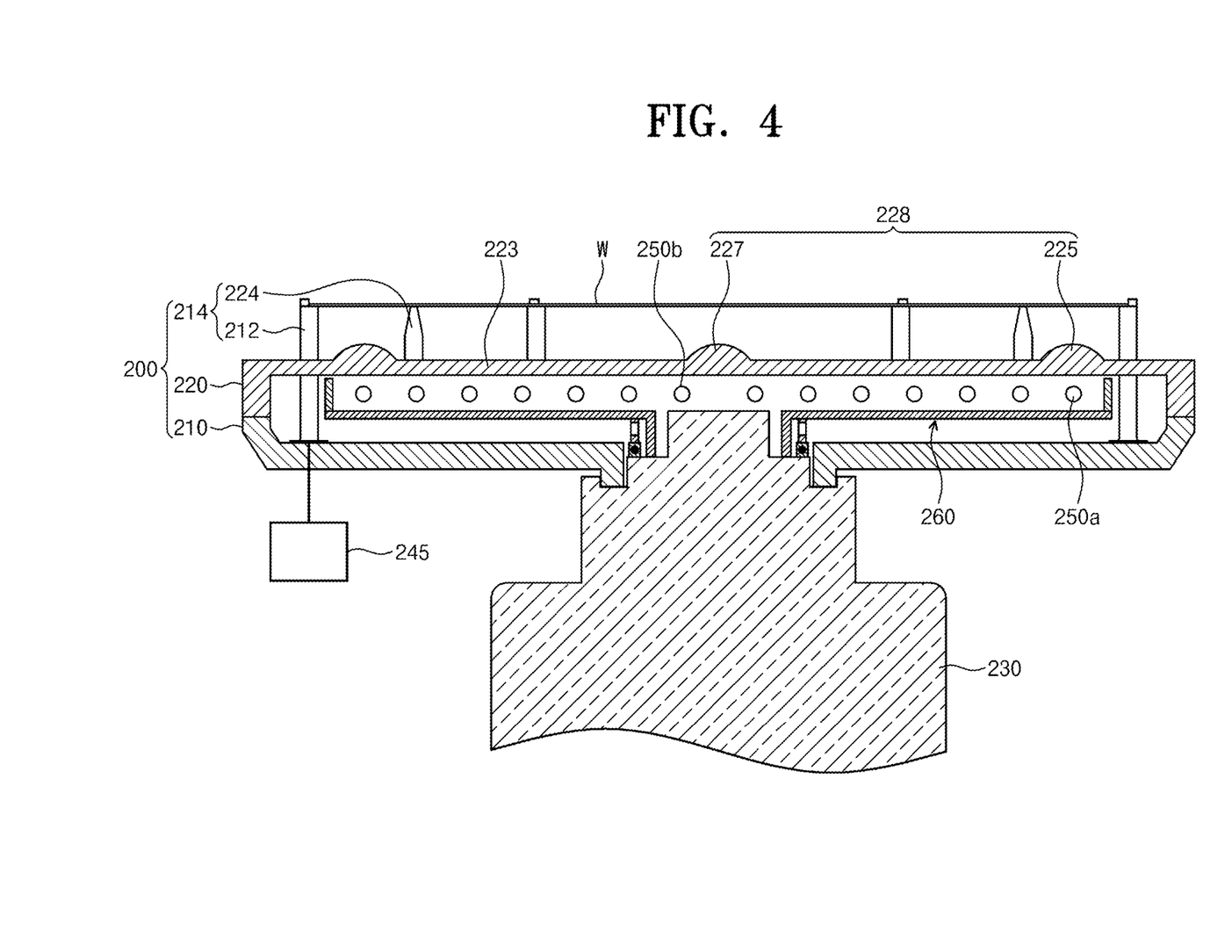
FIG. 4 is a cross-sectional view showing an appearance of a support unit according to one embodiment of the inventive concept.

FIG. 4 is a view showing the support unit 200 according to one embodiment of the inventive concept. Referring to FIG. 4, the support unit 200 supports the substrate W during the process. A lamp 250 heats the substrate W supported on the support unit 200. The support unit 200 includes the chuck stage 210, a window 220, a support member 214, and a rotating unit.

The chuck stage 210 has a circular top surface. The chuck stage 210 is coupled to the rotating unit and is rotated. The window 220 is installed on the chuck stage 210. An interior space isolated from the outside is defined by the window 220 and the chuck stage 210. In one example, the window 220 has a top surface and a ring-shaped side portion. That is, the window 220 rotates with the chuck stage 210.

The window 220 is provided with the support member 214 that supports the substrate W. The support member 214 has a plurality of support pins 224 and a plurality of chuck pins 212. The support pin 224 supports a bottom surface of the substrate W. The chuck pin 212 supports a side surface of the substrate W placed on the support pin 224. The chuck pin 212 is moved by an actuator 245. The plurality of chuck pins 212 are provided. The support pin 224 is located in a space surrounded with the chuck pins 212. The substrate W is spaced away from the window 220 via the support pin 224. Further, when the substrate W is rotated during the process, the chuck pin 212 may prevent the substrate W from being displaced. In one example, the chuck pin 212 is installed on the chuck stage 210. The chuck pin 212 is inserted through a side surface of the window 220 and protrudes above the window 220. The support pin 224 is installed on a top surface of the window 220.

The rotating unit is coupled to the chuck stage 210 and rotates the chuck stage 210.

The lamp 250 is installed inside the support unit 200. The lamp 250 heats the substrate W during the process. The lamp 250 is located in an interior space formed by the window 220 and the chuck stage 210. In one example, the lamp 250 include a plurality of lamps 250. The lamp 250 has a ring shape. The lamps 250 have different diameters. A plurality of lamps 250 may be provided. The lamps 250 are concentric with each other. When viewed from above, a center of the lamp 250 and a center of the substrate W may coincide with each other. In one example, the lamps 250 may be configured so that temperatures thereof may be controlled independently of each other.

Further, a lamp 250a as an outermost lamp among the lamps 250 is closer to a center of the substrate W than the chuck pin 212 is. Thus, the lamp 250a as the outermost lamp of the lamps 250 is located inwardly of an end of the substrate W placed on the support unit 200 when viewed from above.

Under the lamp 250, a reflective member 260 is disposed. The reflective member 260 upwardly reflects the heat radiated in a downward direction from the lamp 250. Thus, the reflective member 260 prevents the chuck stage 210 from being heated due to light energy of the lamp 250.

As described above, the window 220 is located between the substrate W and the lamp 250. The window 220 prevents the treating liquid from entering the interior space and thus prevents the lamp 250 from being damaged by the treating liquid. The window 220 is made of a material that transmits light emitted from the lamp 250.

Figure 5:
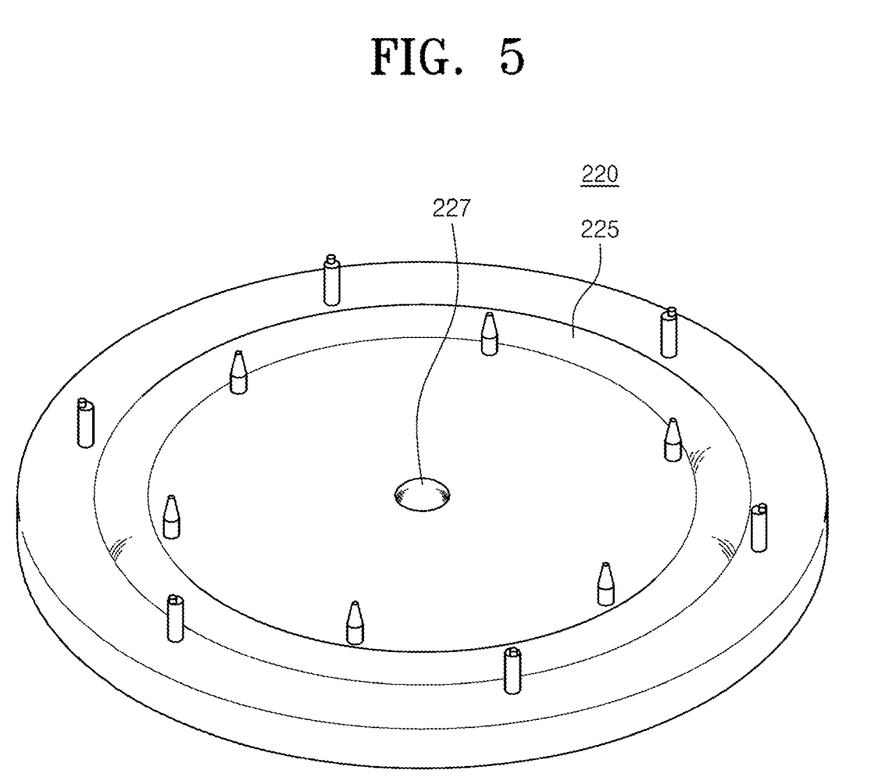
FIG. 5 is a perspective view showing an appearance of a window according to one embodiment of the inventive concept.

FIG. 5 shows an appearance of the window 220 according to one embodiment of the inventive concept. Referring to FIG. 5, the window 220 includes a base 223 and light adjustment means 228. The base 223 is formed in a plate shape. The light adjustment means 228 is formed on the base 223. In one example, the window 220 is made of a material that transmits light emitted from the lamp 250. For example, the window 220 may be made of quartz. In one example, the base 223 and the light adjustment means 228 are made of the same material. The light adjustment means 228 and the base 223 are integral to each other. In contrast, the light adjustment means 228 and the base 223 may be manufactured in a separate manner, and, then, the light adjustment means 228 may be coupled to the base 223. Alternatively, the light adjustment means 228 and the base 223 may be made of different materials.

The light adjustment means 228 directs a portion of the light emitted from the lamp 250 to a certain region on the substrate W. In one example, the light adjustment means 228 may be configured so that a portion of the light irradiated from the lamp 250 concentrates on a certain region on the substrate W. Alternatively, the light adjustment means 228 may be configured to distribute a portion of the light emitted from the lamp 250 onto a wider region.

The light adjustment means 228 includes an edge convex portion 225 and a central convex portion 227. In one example, the edge convex portion 225 and the central convex portion 227 are formed on a top surface of the base 223 and are convex toward the substrate W. In one example, each of the edge convex portion 225 and the central convex portion 227 has a rounded shape. Further, a region of the window 220 between the edge convex portion 225 and the central convex portion may be flat.

The edge convex portion 225 is formed in a region facing an edge region of the substrate W placed on the support unit 200. The edge convex portion 225 extends in a ring shape. When viewed from above, the edge convex portion 225 may overlap the outermost lamp 250a of the lamps 250. Light emitted from the lamp 250a disposed under the edge convex portion 225 among the lamps 250 passes through the edge convex portion 225 toward the edge region of the substrate W.

As described above, as the chuck pin 212 is configured to support the side surface of the substrate W in this embodiment, the outermost lamp 250a of the lamps 250 is located inwardly of an end of the substrate W when viewed from above. Therefore, less light energy of the lamp 250 reaches the edge region of the substrate W, compared to other regions of the substrate W. However, when the edge convex portion 225 is formed, more light energy is irradiated to the edge region of the substrate W than that when the light adjustment means 228 is not formed. This allows sufficient heat to reach the edge region of the substrate W. That is, light energy is intensively irradiated through the edge convex portion 225 to the edge of the substrate W, so that light energy emitted from the lamp 250 reaches the edge region of the substrate W such that an entire surface of the substrate W is irradiated.

The central convex portion 227 is formed in a region facing the central region of the substrate W placed on the support unit 200. The central convex portion 227 has a circular shape when viewed from above. The central convex portion 227 may be located inwardly of the innermost lamp 250b of the lamps 250 when viewed from above. Alternatively, the central convex portion 227 may overlap the innermost lamp 250b of the lamps 250 when viewed from above.

As described above, in the present embodiment, each lamp 250 extends in a ring shape and thus the lamp is not disposed beneath a central region of the substrate W. However, when the central convex portion 227 is formed, more light energy is irradiated to the central region of the substrate W than that when the central convex portion 227 is not formed. This allows sufficient heat to reach the central region of the substrate W. Therefore, even when the number of the lamps 250 corresponding to the central region of the substrate W is smaller than the number of the lamps 250 corresponding to the edge region of the substrate W, light energy emitted from the lamps 250 may spread evenly along the entire surface of the substrate W.

Figure 6:
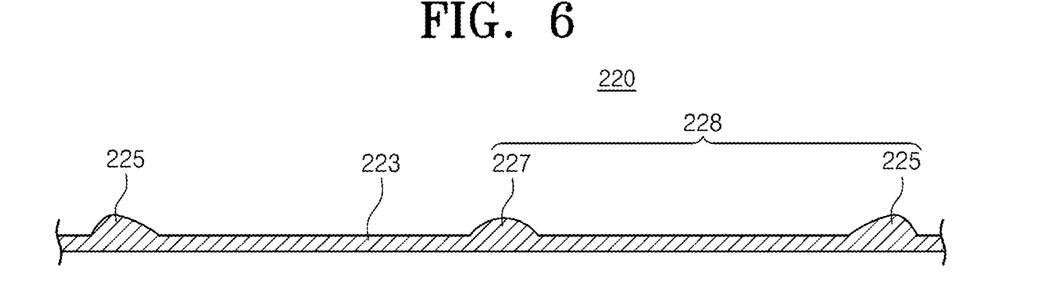
FIG. 6 to FIG. 16 are cross-sectional views showing variations of a window of the inventive concept, respectively.

Each of FIG. 6 to FIG. 16 represents a variation of the window 220 of the inventive concept. Referring to FIG. 6, in one embodiment, the edge convex portion 225 may be constructed so that a region thereof facing a center of the substrate W is more gently curved than a region thereof facing an end of the substrate W. That is, a slope of the region thereof facing the end of the substrate W is larger, so that the light energy from the lamp 250 directed to the end of the substrate W is intensively irradiated to the end of the substrate W. Thus, light irradiated from the lamp 250 disposed under the edge convex portion 225 spreads into a relatively narrow region in a direction toward the end of the substrate W, and spreads into a relatively wide region in a direction toward the center of the substrate W. This allows the entire region of the substrate W to be heated more uniformly.

Figure 7:
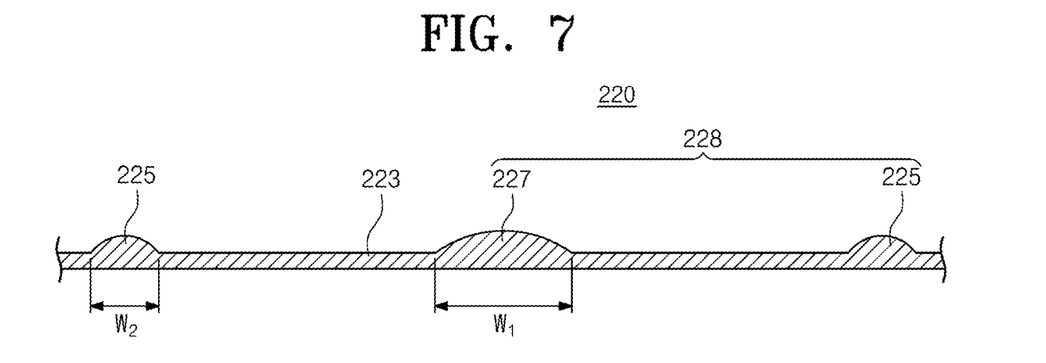

Referring to FIG. 7, in one embodiment, a width W1 of the central convex portion 227 of the window 220 may be larger than a width W2 of the edge convex portion 225 thereof. Thus, the central convex portion 227 is configured to transmit light energy emitted from the lamp 250 to a wider region than the edge convex portion 225 does. When viewed from above, the central convex portion 227 and the innermost lamp 250 overlap with each other.

Figure 8:
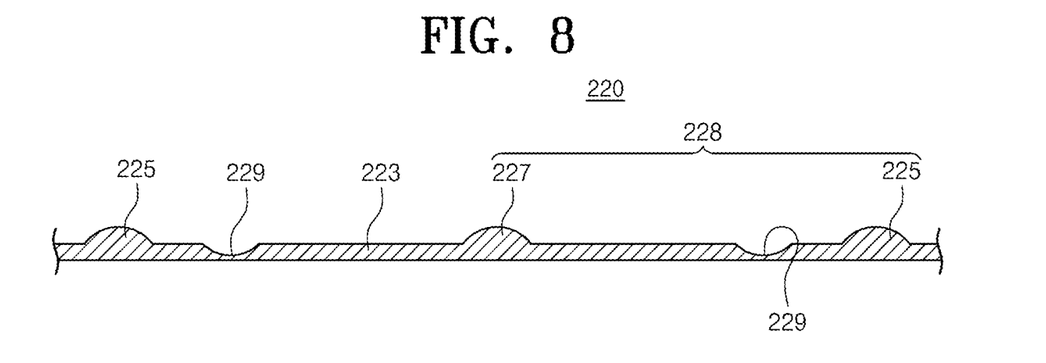

Referring to FIG. 8, the light adjustment means 228 further includes a concave portion 229 in addition to the edge convex portion 225 and the central convex portion 227. The concave portion 229 is located between the central convex portion 227 and the edge convex portion 225. The concave portion 229 may concentrate light emitted from the lamp 250 onto a specific region on the substrate W to allow the specific region to be heated well.

Figure 9:
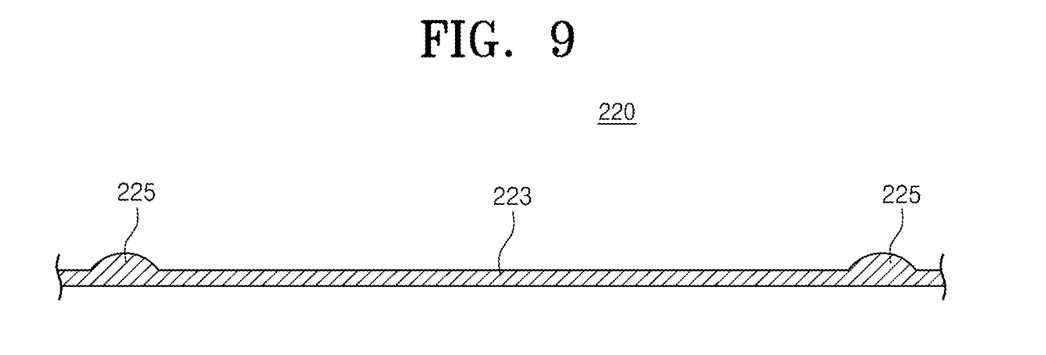

The example in which the edge convex portion 225 and the central convex portion 227 are present simultaneously has been described above. However, the light adjustment means 228 may include only one of the edge convex portion 225 and the central convex portion. In one embodiment, the light adjustment means 228 may include only the edge convex portion 225 among the edge convex portion 225 and the central convex portion 227, as shown in FIG. 9.

Figure 10:
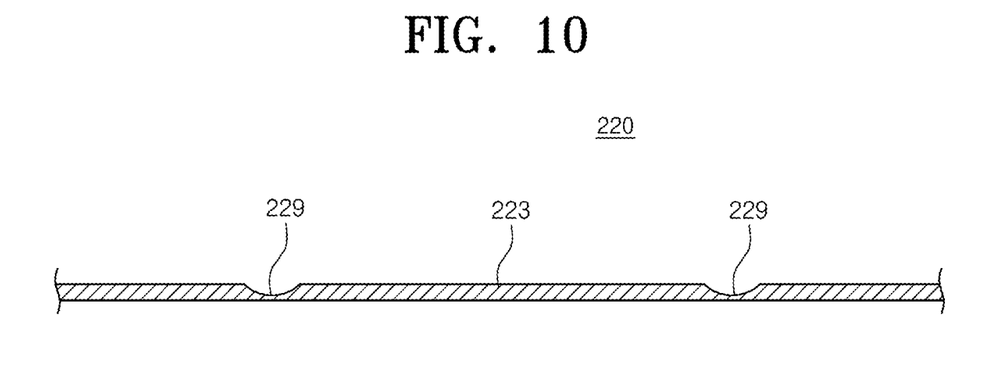

Further, in FIG. 8, the example in which the concave portion 229 is provided between the edge convex portion 225 and the central convex portion 227 has been described above. However, as shown in FIG. 10, the edge convex portion 225 and the central convex portion 227 may not be provided, and only the concave portion 229 may be provided. In this case, the concave portion 229 may face a region to be subjected to intensive heating among regions on the substrate W.

Figure 11:
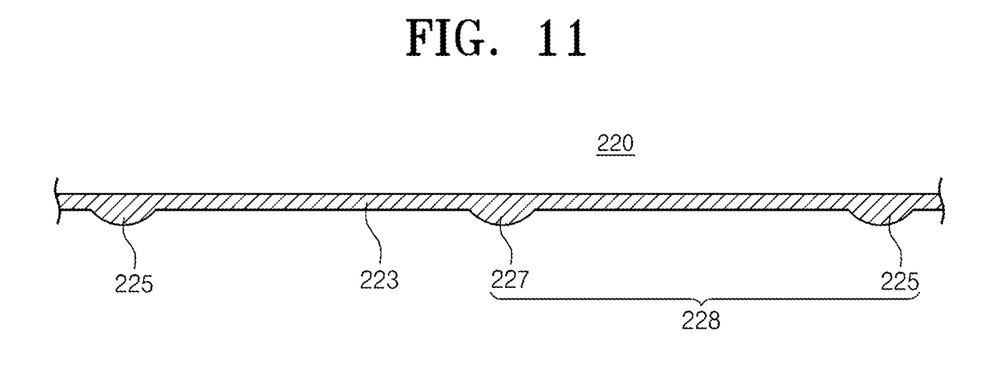

In the above example, the light adjustment means 228 is formed on the top surface of the window 220. However, the light adjustment means 228 may be formed on a bottom surface of the window 220 as shown in FIG. 11.

Figure 12:
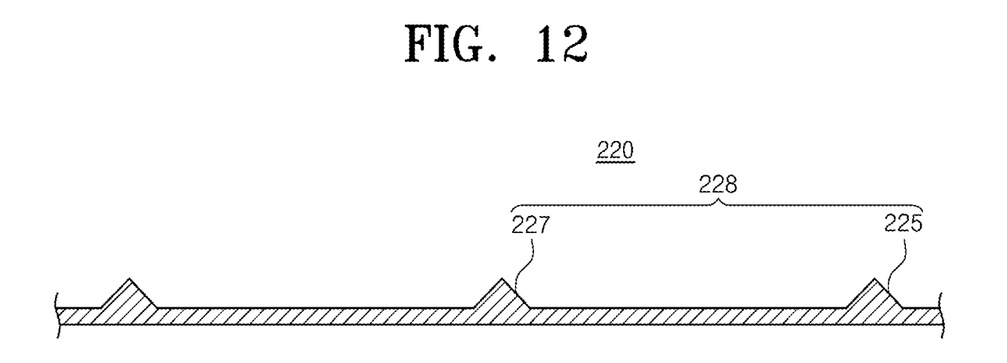

In the above-described example, the light adjustment means is illustrated as having a rounded shape. However, the light adjustment means may have a polygonal shape such as a triangular cross-section, as shown in FIG. 12.

Figure 13:
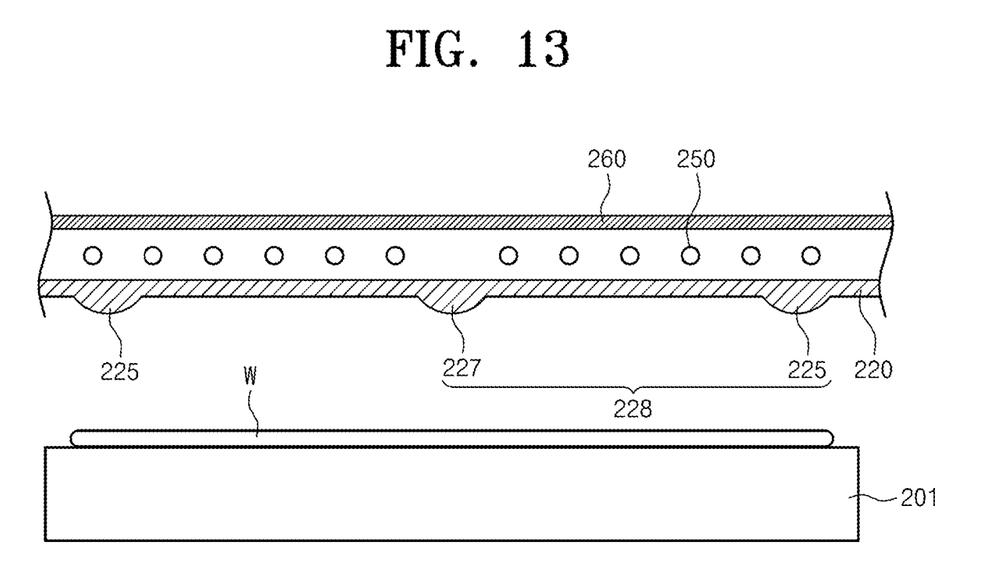

The example in which the window 220 is used for the purpose of heating the bottom surface of the substrate W located on top of the light adjustment means 228 using the light energy irradiated from the lamp 250 below the light adjustment means 228 has been described above. However, the positions of the substrate W and the lamp 250 are not limited thereto. For example, as shown in FIG. 13, the window 220 may be provided between the substrate W and the lamp 250, that is, at a path through which the light of the lamp 250 is transmitted to the substrate W. The light adjustment means 228 may be formed on a face of the window 220 facing the substrate W.

Figure 14:
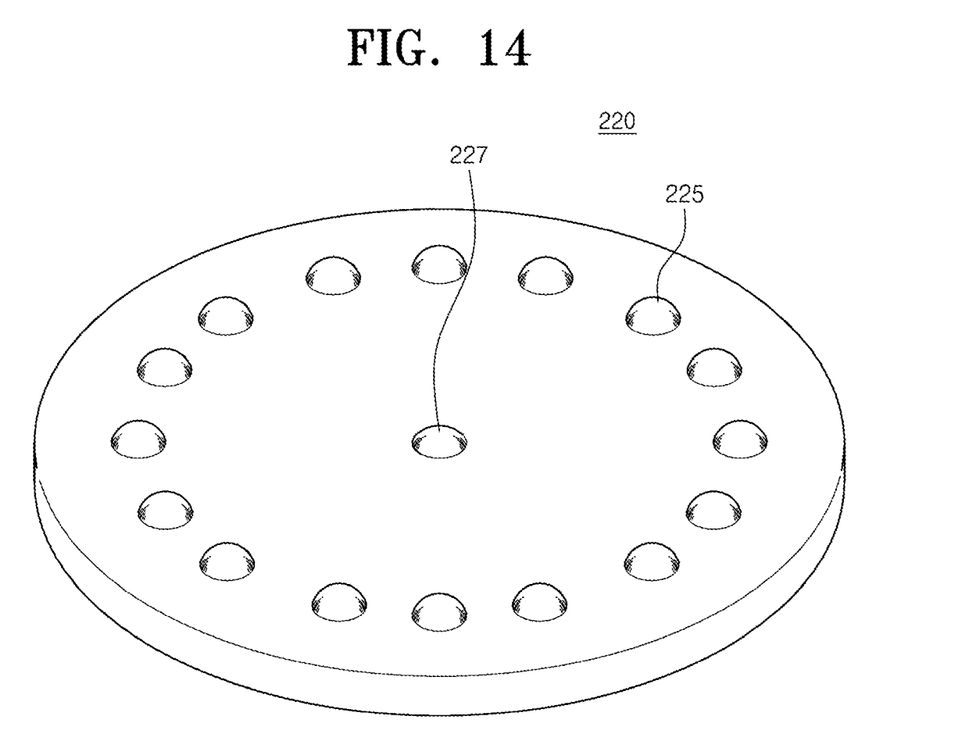

In the above example, the edge convex portion 225 is formed in a ring shape. However, a plurality of the edge convex portions 225 may be present as shown in FIG. 14 and may be arranged in a ring shape.

Figure 15:
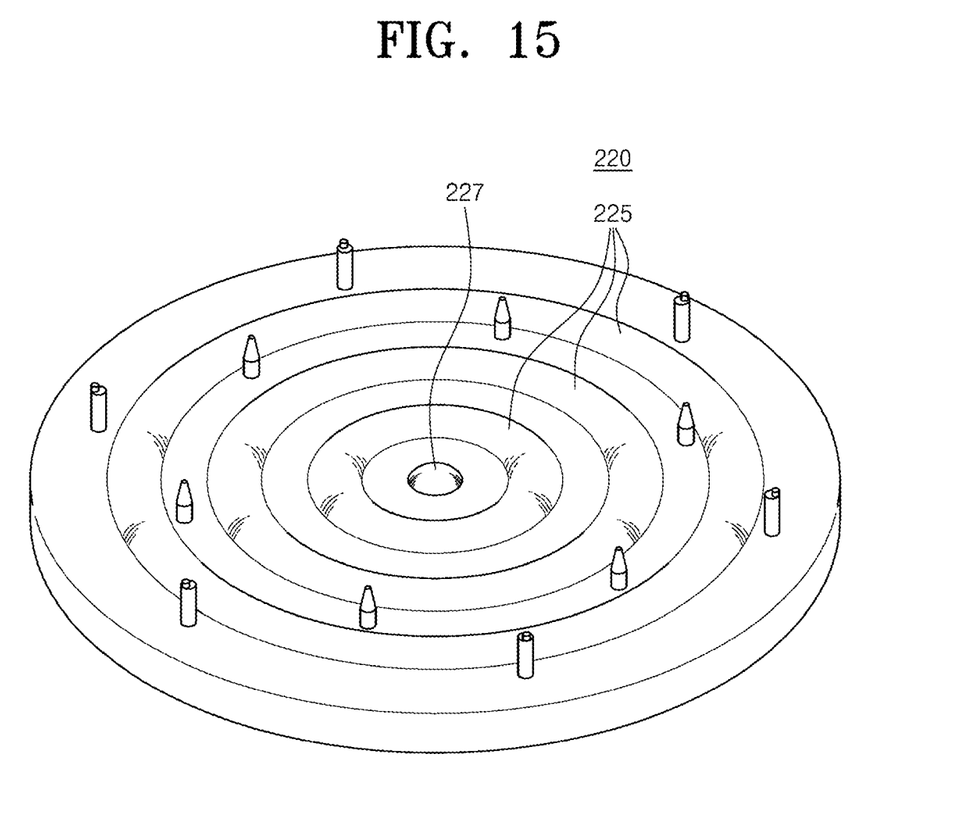
Figure 16:
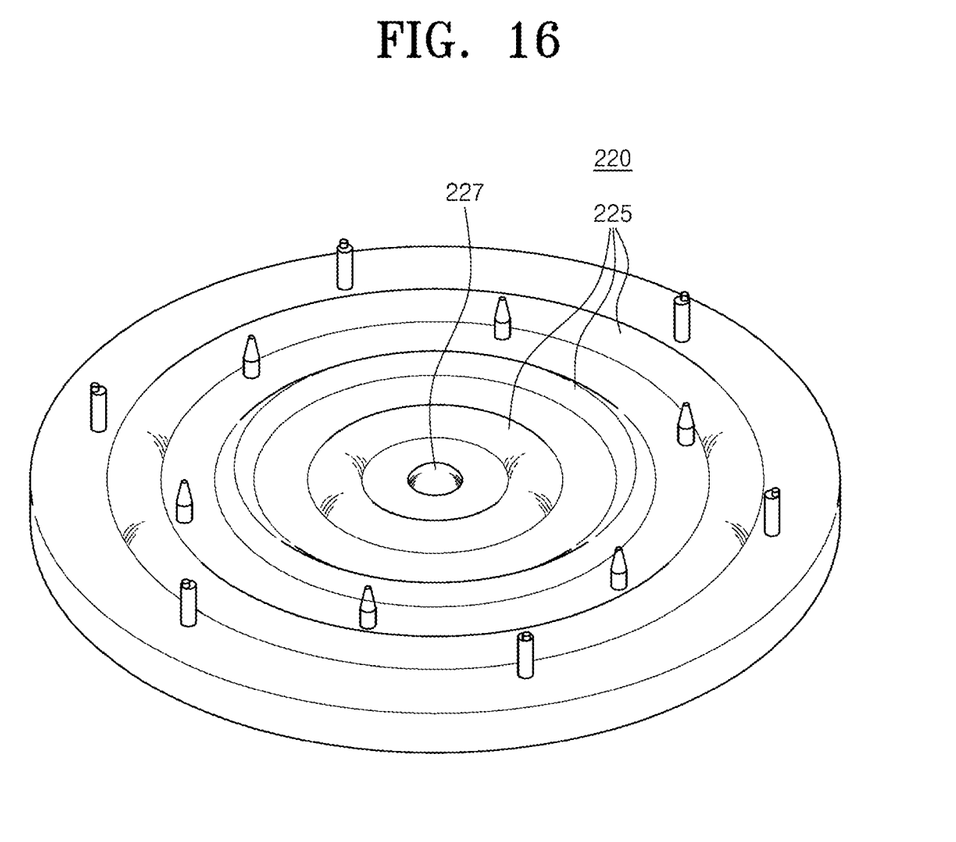

In the above example, one edge convex portion 225 is provided. However, a plurality of the edge convex portions 225 may be disposed as shown in FIG. 15 and FIG. 16. When the plurality of the edge convex portions 225 are provided, the edge convex portions 225 may have the same shape as each other as shown in FIG. 15. Alternatively, when the plurality of the edge convex portions 225 are provided, the edge convex portions 225 may have different shapes or sizes, as shown in FIG. 16.

In the above example, the light adjustment means 228 is used for the purpose of evenly transmitting the light energy emitted from the lamp 250 onto the entire surface of the substrate W. However, the light adjustment means 228 may be used for intensively irradiating a selected region with light energy emitted from the lamp 250 depending on a shape and a size thereof.

In the above example, the support member 214 is installed on the window 220. However, the support member 214 and the window 220 may be spaced apart from each other.

According to one embodiment of the inventive concept, an effect of intensively heating the edge region and the central region of the substrate to improve the temperature distribution of the substrate during the substrate treating process may be achieved.

The effect of the inventive concept is not limited to the effect described above. Effects not mentioned will be clearly understood by those skilled in the art to which the inventive concept belongs from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

REFERENCE NUMERALS

200: Support unit
220: Window
225: Edge convex portion
227: Central convex portion
228: Light adjustment means
250: the lamp

What is claimed is:

1. An apparatus for treating a substrate, the apparatus comprising:
   a process chamber having a treatment space defined therein;
   a support unit for supporting the substrate in the treatment space;
   a liquid supply unit for supplying treating liquid to the substrate supported on the support unit; and
   a plurality of lamps disposed in the support unit for heating the substrate supported on the support unit, wherein the support unit includes:
a rotatable chuck stage disposed below the lamps to rotate the substrate; and
a window disposed above the lamps to transmit light emitted from the lamps, wherein the window includes:
a base in a form of a plate; and
a light adjuster formed on the base to adjust a direction or an amount of light emitted from the lamps, and
wherein the rotatable chuck stage and the window are disposed on opposing sides of the lamps.

2. The apparatus of claim 1, wherein the light adjuster includes an edge convex portion protruding from the base, wherein a position of the edge convex portion corresponds to an edge region of the substrate placed on the support unit.

3. The apparatus of claim 1, wherein the light adjuster includes a central convex portion protruding from the base, wherein a position of the central convex portion corresponds to a central region of the substrate placed on the support unit.

4. The apparatus of claim 1, wherein the light adjuster includes:
an edge convex portion protruding from the base, wherein a position of the edge convex portion corresponds to an edge region of the substrate placed on the support unit; and
a central convex portion protruding from the base, wherein a position of the central convex portion corresponds to a central region of the substrate placed on the support unit.

5. The apparatus of claim 1, wherein the support unit includes:
a support pin extending from a top surface of the window to a bottom surface of the substrate; and
a chuck pin extending from a top surface of the rotatable chuck stage to a side surface of the substrate, and
wherein the support pin is installed on the base of the window away from the light adjuster.

6. The apparatus of claim 2, wherein the edge convex portion has an inward portion and an outward portion, wherein the inward portion has a top inclined face having a smaller inclination than an inclination of a top inclined face of the outward portion.

7. The apparatus of claim 2, wherein the edge convex portion extends in a ring shape.

8. The apparatus of claim 4, wherein a width of the central convex portion is larger than a width of the edge convex portion.

9. The apparatus of claim 4, wherein a region of the window between the edge convex portion and the central convex portion is flat.

10. The apparatus of claim 4, wherein the light adjuster further includes a concave portion recessed in the base, wherein the concave portion is disposed between the edge convex portion and the central convex portion to spread light emitted from the lamps.

11. The apparatus of claim 1, wherein an outermost lamp among the lamps is located inwardly of an end of the substrate placed on the support unit when viewed from above.

12. The apparatus of claim 1, wherein the light adjuster is formed on a top surface of the window.

13. The apparatus of claim 1, wherein the light adjuster is formed on a bottom surface of the window.

14. The apparatus of claim 1, wherein each of the lamps extends in a ring shape, and the lamps are concentric with each other.

15. The apparatus of claim 1, wherein the base and the light adjuster are integrally formed with each other.

16. The apparatus of claim 1, wherein the treating liquid includes phosphoric acid.

17. The apparatus of claim 1, wherein the window is made of quartz.

18. An apparatus for treating a substrate, the apparatus comprising:
a support member for supporting the substrate;
a lamp for heating the substrate placed on the support member; and
a window placed between the lamp and the substrate placed on the support member to transmit light emitted from the lamp,
wherein the window includes:
a base in a form of a plate; and
a light adjuster formed on the base to converge or spread light emitted from the lamp,
wherein the support member includes a rotatable chuck stage disposed below the lamp to rotate the substrate, and
wherein the rotatable chuck stage and the window are disposed on opposing sides of the lamp.

19. The apparatus of claim 18, wherein the light adjuster includes:
an edge convex portion protruding from the base, wherein a position of the edge convex portion corresponds to an edge region of the substrate placed on the support member; and
a central convex portion protruding from the base, wherein a position of the central convex portion corresponds to a central region of the substrate placed on the support unit.

20. The apparatus of claim 19, wherein a region of the window between the edge convex portion and the central convex portion is flat.

* * * * *